US006804361B2

(12) United States Patent
Hosoi et al.

(10) Patent No.: US 6,804,361 B2
(45) Date of Patent: Oct. 12, 2004

(54) SOUND SIGNAL PLAYBACK MACHINE AND METHOD THEREOF

(75) Inventors: Shintaro Hosoi, Saitama (JP); Hiroyuki Hamada, Saitama (JP)

(73) Assignee: Pioneer Corporation, Tokyo (JP)

( * ) Notice: Subject to any disclaimer, the term of this patent is extended or adjusted under 35 U.S.C. 154(b) by 310 days.

(21) Appl. No.: 10/164,411

(22) Filed: Jun. 10, 2002

(65) Prior Publication Data

US 2002/0186854 A1 Dec. 12, 2002

(30) Foreign Application Priority Data

Jun. 12, 2001 (JP) .................................... P2001-176399

(51) Int. Cl.[7] ........................... H03G 3/00; H03G 5/00; H04R 5/02

(52) U.S. Cl. ........................... 381/99; 381/97; 381/61; 381/307

(58) Field of Search ........................... 381/97, 98, 99, 381/1, 61, 300, 307, 103, 310

(56) References Cited

U.S. PATENT DOCUMENTS 4,589,135 A 5/1986 Baker
5,230,022 A * 7/1993 Sakata ......................... 381/98
5,325,435 A 6/1994 Date et al.
5,377,274 A * 12/1994 Meyer et al. ................. 381/59
5,642,429 A * 6/1997 Janssen ...................... 381/182
5,930,374 A * 7/1999 Werrbach et al. ............. 381/99
6,169,812 B1 * 1/2001 Miller ........................ 381/300
6,606,388 B1 * 8/2003 Townsend et al. ............ 381/17

FOREIGN PATENT DOCUMENTS

DE 195 33 946 A1 6/1996

OTHER PUBLICATIONS

Japanese Abstract No. 04357800, dated Dec. 10, 1992.

* cited by examiner

*Primary Examiner*—Xu Mei
*Assistant Examiner*—Laura A. Grier
(74) *Attorney, Agent, or Firm*—Sughrue Mion, PLLC

(57) ABSTRACT

In a sound signal playback machine and method thereof, predetermined high frequency components are extracted from sound signals $S_L$ to $S_C$ of a main channel by high frequency pass filters 21 to 25, and these high frequency components are respectively played back by speakers. At the same time, predetermined low frequency components are extracted from sound signals $S_L$ to $S_C$ of the main channel by low frequency pass filters. These low frequency components and sound signal $S_{LFE}$ exclusively used for the low frequency band are added to each other, and the thus obtained addition signal is played back by the speaker 66. In this case, the degree of the low frequency pass filters is set higher than the degree of the high frequency pass filters, and the high frequency component is delayed.

18 Claims, 10 Drawing Sheets

SOUND SIGNAL PLAYBACK MACHINE AND METHOD THEREOF

BACKGROUND OF THE INVENTION

1. Field of the Invention

The present invention relates to a sound signal playback machine and method thereof for playing back multichannel sounds.

2. Description of the Related Art

Concerning the sound signal playback machine for playing back multichannel sounds, for example, a sound signal playback machine to realize 5.1 surround playback is well known. FIG. 10 is a block diagram showing an example of such a sound signal playback machine. In FIG. 10, the signal input terminal 101, to which sound signal $S_L$ of L-channel (left channel) is supplied, is connected to the speaker 131, which is arranged at the front on the left, via HPF (high-pass filter) 111 and the amplifier 121. At the same time, the signal input terminal 101 is connected to the signal adder 151 via LPF (low-pass filter) 141. The signal input terminal 102, to which sound signal $S_R$ of R-channel (right channel) is supplied, is connected to the speaker 132, which is arranged at the front on the right, via HPF 112 and the amplifier 122. At the same time, the signal input terminal 102 is connected to the signal adder 151 via LPF 142. The signal input terminal 103, to which sound signal $S_{SL}$ of SL-channel (surround left channel) is supplied, is connected to the speaker 133, which is arranged at the rear on the left, via HPF 113 and the amplifier 123. At the same time, the signal input terminal 103 is connected to the signal adder 151 via LPF 143. The signal input terminal 104, to which sound signal $S_{SR}$ of SR-channel (surround right channel) is supplied, is connected to the speaker 134, which is arranged at the rear on the right, via HPF 114 and the amplifier 124. At the same time, the signal input terminal 104 is connected to the signal adder 151 via LPF 144. Further, the signal input terminal 105, to which sound signal $S_C$ of C channel (central channel) is supplied, is connected to the speaker 135, which is arranged at the front center, via HPF 115 and the amplifier 125. At the same time, the signal input terminal 105 is connected to the signal adder 151 via LPF 145. On the other hand, the signal input terminal 106, to which sound signal $S_{LFE}$ of LFE channel (channel exclusively used for the low frequency band) is supplied, is connected to the signal adder 152 to which the above signal adder 151 is connected. This signal adder 152 is connected to the speaker 136, which is arranged on the side, via the amplifier 126. In this case, the speakers 131 to 135 respectively compose a speaker system for playing back sounds of middle low frequency and higher frequency than that. In general, they are referred to as a satellite speaker system. The speaker 136 is a speaker system for playing back sounds of low frequency. In general, the speaker 136 is referred to as a sub-woofer.

In this connection, the above conventional sound signal playback machine is designed so that the frequency response can be flat when signals on the low frequency side and those on the high frequency side are electrically synthesized with each other. Further, in the above conventional sound signal playback machine, it is necessary to use a filter of the high order so that the band width, in which the frequency response on the low frequency side and that on the high frequency side cross each other, can be reduced. Accordingly, the following problems may be encountered. The frequency response of signals, which are obtained when signals on the low frequency side and signals on the high frequency side are electrically synthesized with each other, are flat as shown in FIG. 11, however, as shown in FIG. 12, a group delay in the low frequency band is increased, which causes such a problem that sounds of low frequency can not be faithfully played back and further a nuance of sounds of a musical instrument of low frequency is changed. In the case where sound signal $S_{LFE}$ of channel LFE and sound signals $S_L$ to $S_C$ of the other channels (main channels) are correlated with each other, a group delay is increased in the low frequency band when sound signal $S_{LFE}$ in channel LFE is added.

SUMMARY OF THE INVENTION

The present invention has been accomplished in view of the above circumstances. It is an object of the present invention to provide a sound signal playback machine and method thereof capable of making a group delay characteristic of signals, which are obtained when signals on the low frequency side and signals on the high frequency side are synthesized with each other, flat so that sounds of low frequency can be faithfully played back and a nuance of sounds of a musical instrument of low frequency can be improved.

In order to accomplish the above object, first, the present invention provides a sound signal playback machine comprising: a high frequency pass filter for extracting a predetermined high frequency component from a sound signal in a main channel; a first speaker for playing back the high frequency component extracted by the high frequency pass filter; a low frequency pass filter for extracting a predetermined low frequency component from the sound signal in the main channel; a signal adder for outputting an addition signal in which the low frequency component extracted by the low frequency pass filter is added to a sound signal in a channel exclusively used for a low frequency band; and a second speaker for playing back the addition signal outputted from the signal adder, wherein the degree of the low frequency pass filter is set higher than that of the high frequency pass filter, the sound signal playback machine further comprising a phase matching means for matching the phase of the high frequency component extracted by the high frequency pass filter with the phase of the low frequency component extracted by the low frequency pass filter. According to the sound signal playback machine composed as described above, it is possible to make a group delay characteristic of signals, which are obtained when signals on the low frequency side and signals on the high frequency side are electrically synthesized with each other, substantially flat.

Secondly, the present invention provides a sound signal playback machine according to the above item 1, wherein the phase matching means is a delay circuit for delaying the high frequency component extracted by the high frequency pass filter. According to the sound signal playback machine composed as described above, it is possible to make a group delay characteristic of signals, which are obtained when signals on the low frequency side and signals on the high frequency side are electrically synthesized with each other, substantially flat.

Thirdly, the present invention provides a sound signal playback machine according to the above item 2, wherein delay time T1 (sec) of the delay circuit is set at a value calculated by the equation of $$T1=(\phi 1-\phi 2+\pi \cdot n)/(2\pi Fc)$$

(n=. . . −2, −1, 0, 1, 2 . . . )

where $\phi 1$ (rad) is a phase angle at a cut-off frequency Fc (Hz) of the high frequency pass filter, and $\phi 2$ (rad) is a phase angle of the low frequency pass filter. According to the sound signal playback machine composed as described above, it is possible to make a group delay characteristic of signals, which are obtained when signals on the low frequency side and signals on the high frequency side are electrically synthesized with each other, substantially flat.

Fourthly, the present invention provides a sound signal playback machine according to the above item 1, wherein the phase matching means is to set the first speaker by moving it in a direction so that the first speaker can be separated from a listener. According to the sound signal playback machine composed as described above, it is possible to make a group delay characteristic of signals, which are obtained when signals on the low frequency side and signals on the high frequency side are electrically synthesized with each other, substantially flat.

Fifthly, the present invention provides a sound signal playback machine according to the above item 1, wherein the phase matching means is to set the second speaker by moving it in a direction so that the second speaker can be approached to a listener, and the phase matching means is also a delay circuit for delaying the addition signal outputted from the signal adder. According to the sound signal playback machine composed as described above, it is possible to make a group delay characteristic of signals, which are obtained when signals on the low frequency side and signals on the high frequency side are electrically synthesized with each other, substantially flat.

Sixthly, the present invention provides a sound signal playback machine according to one of the above items 1 to 5, further comprising an auxiliary phase matching means for matching the phase of the low frequency component extracted by the low frequency pass filter with the phase of the sound signal in the channel exclusively used for the low frequency band. According to the sound signal playback machine composed as described above, it is possible to make a group delay characteristic of signals, which are obtained when signals on the low frequency side and signals on the high frequency side are electrically synthesized with each other, substantially flat. Even when sound signals in the channel exclusively used for the low frequency band and sound signals in the main channel are correlated with each other, there is no possibility that the group delay is increased in the low frequency band.

Seventhly, the present invention provides a sound signal playback machine according to the above item 6, wherein the auxiliary phase matching means is a delay circuit for delaying the sound signal in the channel exclusively used for the low frequency band. According to the sound signal playback machine composed as described above, it is possible to make a group delay characteristic of signals, which are obtained when signals on the low frequency side and signals on the high frequency side are electrically synthesized with each other, substantially flat. Even when sound signals in the channel exclusively used for the low frequency band and sound signals in the main channel are correlated with each other, there is no possibility that the group delay is increased in the low frequency band.

Eighthly, the present invention provides a sound signal playback machine according to the above item 7, wherein delay time T2 (sec) of the delay circuit is set at a value calculated by the equation of $$T2=(\phi 1+\pi\cdot n)/(2\pi\cdot Fc)$$

(n=. . . −2, −1, 0, 1, 2 . . . )

where $\phi 1$ (rad) is a phase angle at a cut-off frequency Fc (Hz) of the high frequency pass filter. According to the sound signal playback machine composed as described above, it is possible to make a group delay characteristic of signals, which are obtained when signals on the low frequency side and signals on the high frequency side are electrically synthesized with each other, substantially flat. Even when sound signals in the channel exclusively used for the low frequency band and sound signals in the main channel are correlated with each other, there is no possibility that the group delay is increased in the low frequency band.

Ninthly, the present invention provides a sound signal playback machine according to one of the above items 1 to 5, further comprising a phase inversion circuit for inverting a phase of the low frequency component extracted by the low frequency pass filter when a difference between the phase of the low frequency component extracted by the low frequency pass filter and the phase of the sound signal in the channel exclusively used for the low frequency is $\pi$ (rad). According to the sound signal playback machine composed as described above, it is possible to make a group delay characteristic of signals, which are obtained when signals on the low frequency side and signals on the high frequency side are electrically synthesized with each other, substantially flat.

Tenthly, the present invention provides a sound signal playback method comprising the steps of: extracting a predetermined high frequency component from a sound signal in a main channel by a high frequency pass filter; playing back the high frequency component, which has been extracted by the high frequency pass filter, by a first speaker; extracting a predetermined low frequency component from the sound signal in the main channel by a low frequency pass filter; adding the low frequency component extracted by the low frequency pass filter to a sound signal in the channel exclusively used for the low frequency by a signal adder and outputting an addition signal; and playing back the addition signal, which has been outputted from the signal adder, by a second speaker, wherein the degree of the low frequency pass filter is set higher than that of the high frequency pass filter, and the phase of the high frequency component extracted by the high frequency pass filter and the phase of the low frequency component extracted by the low frequency pass filter are matched with each other. According to the sound signal playback method described above, it is possible to make a group delay characteristic of signals, which are obtained when signals on the low frequency side and signals on the high frequency side are electrically synthesized with each other, substantially flat.

Eleventhly, the present invention provides a sound signal playback method according to the above item 10, wherein the phase of the high frequency component extracted by the high frequency pass filter and the phase of the low frequency component extracted by the low frequency pass filter are matched with each other when the high frequency component extracted by high frequency pass filter is delayed by the delay circuit. According to the sound signal playback method described above, it is possible to make a group delay characteristic of signals, which are obtained when signals on the low frequency side and signals on the high frequency side are electrically synthesized with each other, substantially flat.

Twelfthly, the present invention provides a sound signal playback method according to the above item 11, wherein delay time T1 (sec) of the delay circuit is set at a value calculated by the equation of $$T1=(\phi 1-\phi 2+\pi\cdot n)/(2\pi\cdot Fc)$$

(n=. . . −2, −1, 0, 1, 2 . . . )

where $\phi 1$ (rad) is a phase angle at a cut-off frequency Fc (Hz) of the high frequency pass filter, and $\phi 2$ (rad) is a phase angle of the low frequency pass filter. According to the sound signal playback method described above, it is possible to make a group delay characteristic of signals, which are obtained when signals on the low frequency side and signals on the high frequency side are electrically synthesized with each other, substantially flat.

Thirteenthly, the present invention provides a sound signal playback method according to the above item 10, wherein the phase of the high frequency component extracted by the high frequency pass filter and the phase of the low frequency component extracted by the low frequency pass filter are matched with each other when the first speaker is arranged by moving so that it can be separated from a listener. According to the sound signal playback method described above, it is possible to make a group delay characteristic of signals, which are obtained when signals on the low frequency side and signals on the high frequency side are electrically synthesized with each other, substantially flat.

Fourteenthly, the present invention provides a sound signal playback method according to the above item 10, wherein the phase of the high frequency component extracted by the high frequency pass filter and the phase of the low frequency component extracted by the low frequency pass filter are matched with each other when the second speaker is arranged by moving so that it can be separated from a listener and the addition signal outputted from the signal adder is delayed by the delay circuit. According to the sound signal playback method described above, it is possible to make a group delay characteristic of signals, which are obtained when signals on the low frequency side and signals on the high frequency side are electrically synthesized with each other, substantially flat.

Fifteenthly, the present invention provides a sound signal playback method according to one of the above items 10 to 14, wherein the phase of the low frequency component extracted by the low frequency pass filter and the phase of the sound signal in the channel exclusively used for the low frequency band are matched with each other. According to the sound signal playback method described above, it is possible to make a group delay characteristic of signals, which are obtained when signals on the low frequency side and signals on the high frequency side are electrically synthesized with each other, substantially flat. Even when sound signals in the channel exclusively used for the low frequency band and sound signals in the main channel are correlated with each other, there is no possibility that the group delay is increased in the low frequency band.

Sixteenthly, the present invention provides a sound signal playback method according to the above item 15, wherein the phase of the low frequency component extracted by the low frequency pass filter and the phase of the sound signal in the channel exclusively used for the low frequency band are matched with each other by delaying the sound signal in the channel exclusively used for the low frequency band by the delay circuit. According to the sound signal playback method described above, it is possible to make a group delay characteristic of signals, which are obtained when signals on the low frequency side and signals on the high frequency side are electrically synthesized with each other, substantially flat. Even when sound signals in the channel exclusively used for the low frequency band and sound signals in the main channel are correlated with each other, there is no possibility that the group delay is increased in the low frequency band.

Seventeenthly, the present invention provides a sound signal playback method according to the above item 16, wherein delay time T2 (sec) of the delay circuit is set at a value calculated by the equation of $$T2=(\phi 1+\pi\cdot n)/(2\pi\cdot Fc)$$

(n=. . . −2, −1, 0, 1, 2 . . . )

where $\phi 1$ (rad) is a phase angle at a cut-off frequency Fc (Hz) of the high frequency pass filter. According to the sound signal playback method described above, it is possible to make a group delay characteristic of signals, which are obtained when signals on the low frequency side and signals on the high frequency side are electrically synthesized with each other, substantially flat. Even when sound signals in the channel exclusively used for the low frequency band and sound signals in the main channel are correlated with each other, there is no possibility that the group delay is increased in the low frequency band.

Eighteenthly, the present invention provides a sound signal playback method according to one of the above items 10 to 14, wherein the phase of the low frequency component extracted by the low frequency pass filter is inverted by the phase inversion circuit when a difference between the phase of the low frequency component extracted by the low frequency pass filter and the phase of the sound signal in the channel exclusively used for the low frequency is π (rad). According to the sound signal playback method described above, it is possible to make a group delay characteristic of signals, which are obtained when signals on the low frequency side and signals on the high frequency side are electrically synthesized with each other, substantially flat.

DETAILED DESCRIPTION OF THE PREFERRED EMBODIMENTS

Referring to the accompanying drawings, embodiments of the present invention will be explained in detail as follows.

First Embodiment

Figure 1:
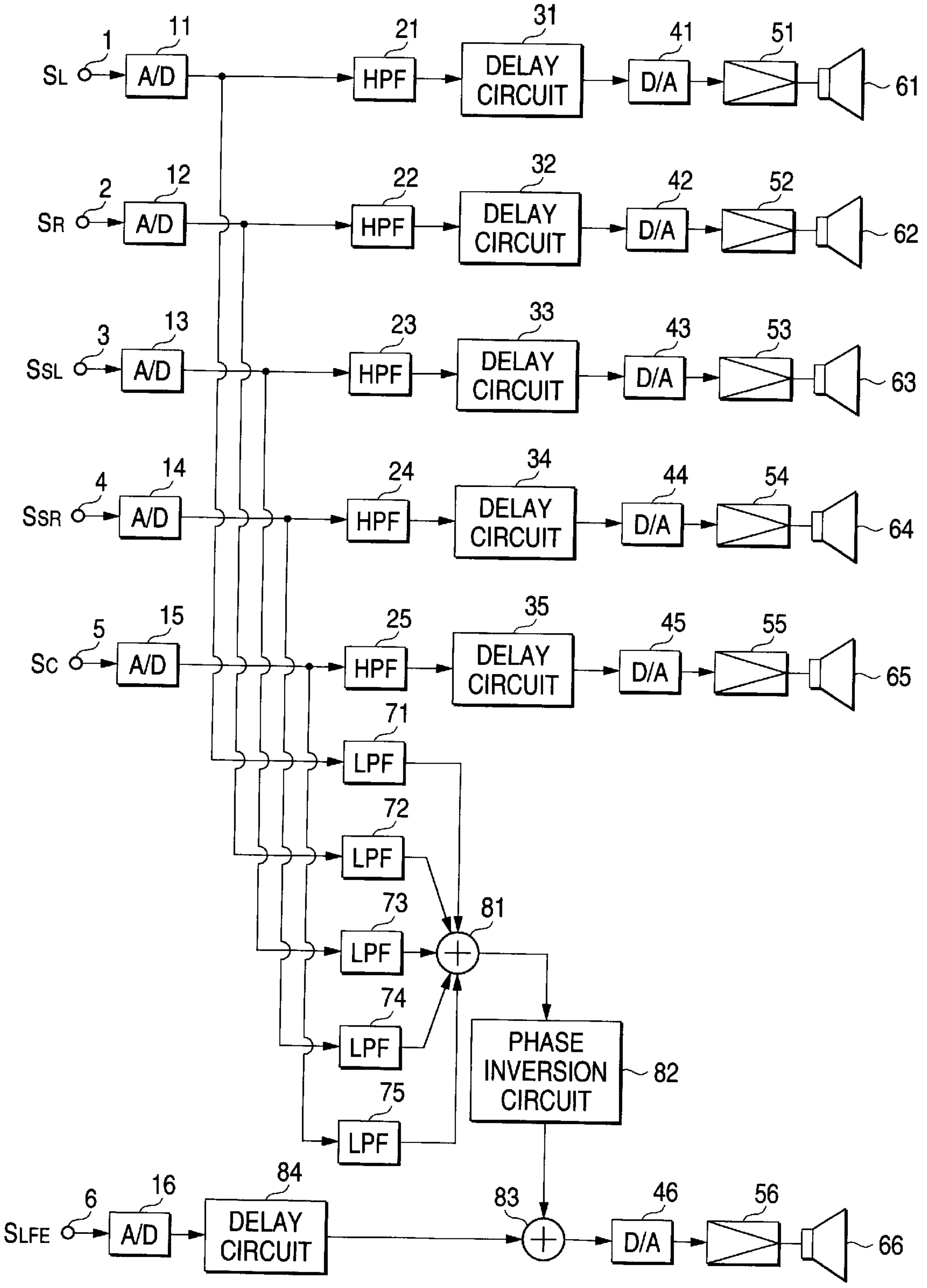
FIG. 1 is a block diagram showing a sound signal playback machine of the first embodiment of the present invention.

FIG. 1 is a block diagram showing a sound signal playback machine of the first embodiment of the present invention. In FIG. 1, the signal input terminal 1, to which sound signal $S_L$ of channel L (left channel) is supplied, is connected to the speaker 61 via the A/D converter 11 for converting analog/digital, HPF (high-pass filter) 21, delay circuit 31 for delaying a signal, D/A converter 41 for converting digital/analog and amplifier 51. Further, the signal input terminal 1 is connected to the signal adder 81 for adding a signal via the A/D converter 11 and LPF (low-pass filter) 71. The signal input terminal 2, to which sound signal $S_R$ of channel R (right channel) is supplied, is connected to the speaker 62 via the A/D converter 12, HPF 22, delay circuit 32, D/A converter 42 and amplifier 52. Further, the signal input terminal 2 is connected to the signal adder 81 for adding a signal via the A/D converter 12 and LPF 72. The signal input terminal 3, to which sound signal $S_{SL}$ of channel SL (surround left channel) is supplied, is connected to the speaker 63 via the A/D converter 13, HPF 23, delay circuit 33, D/A converter 43 and amplifier 53. Further, the signal input terminal 3 is connected to the signal adder 81 for adding a signal via the A/D converter 13 and LPF 73. Further, the signal input terminal 4, to which sound signal $S_{SR}$ of channel SR (surround right channel) is supplied, is connected to the speaker 64 via the A/D converter 14, HPF 24, delay circuit 34, D/A converter 44 and amplifier 54. Furthermore, the signal input terminal 4 is connected to the signal adder 81 for adding a signal via the A/D converter 14 and LPF 74. The signal input terminal 5, to which sound signal $S_C$ of channel C (central channel) is supplied, is connected to the speaker 65 via the A/D converter 15, HPF 25, delay circuit 35, D/A converter 45 and amplifier 55. Further, the signal input terminal 5 is connected to the signal adder 81 for adding a signal via the A/D converter 15 and LPF 75. This signal adder 81 is connected to the signal adder 83 via the phase inversion circuit 82 for inverting a phase of a signal under the condition described later. On the other hand, the signal input terminal 6, to which sound signal $S_{LFE}$ of channel LFE (channel exclusively used for the low frequency channel) is supplied, is connected to the signal adder 83 via A/D converter 16 and the delay circuit 84 for delaying a signal. This signal adder 83 is connected to the speaker 66 via D/A converter 46 and the amplifier 56.

Figure 2:
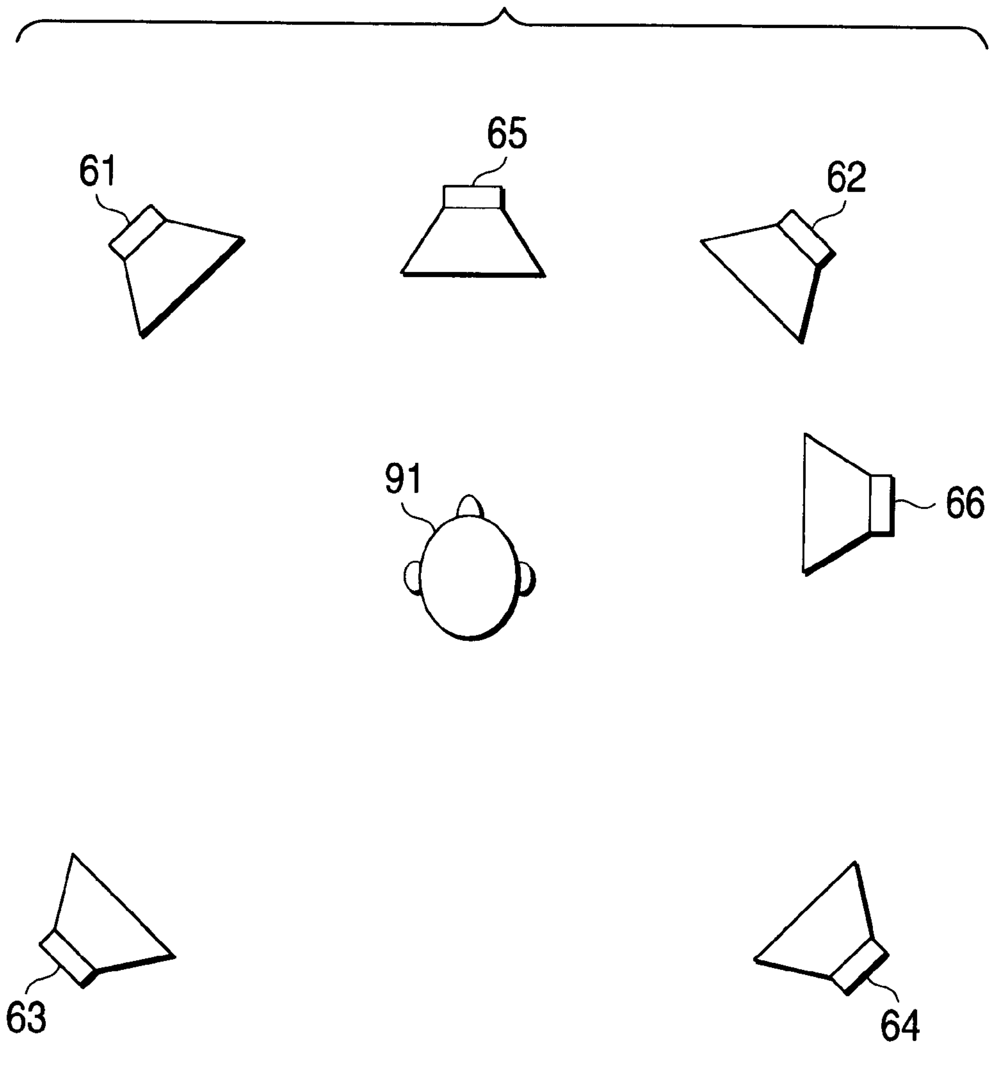
FIG. 2 is a view showing a position at which a speaker is arranged with respect to a listener in a sound signal playback machine of the first embodiment of the present invention.

In this case, the speakers 61 to 65 compose a speaker system for playing back sounds of middle low frequency and higher frequency than that. In general, they are referred to as a satellite speaker system. The speaker 66 is a speaker system for playing back sounds of low frequency. In general, the speaker 66 is referred to as a sub-woofer. These speakers 61 to 66 are arranged, for example, as shown in FIG. 2. That is, the speaker 61 for channel L is arranged at the front on the left with respect to the listener 91, the speaker 62 for channel R is arranged at the front on the right, the speaker 63 for channel SL is arranged at the rear on the left, the speaker 64 for channel SR is arranged at the rear on the right, the speaker 65 for channel C is arranged at the front center, and the speaker 66 for channel LFE is arranged on the side.

HPF 21 to 25 respectively extract a predetermined high frequency component from the digitized sound signal of the channel (main channel) except for channel LFE. LPF 71 to 75 extract a predetermined low frequency component from the digitized sound signal in the same manner. When the degree of HPF 21 to 25 is N1 and the degree of LPF 71 to 75 is N2, it is set that N2>N1, that is, it is set that the degree of LPF 71 to 75 is higher than the degree of HPF 21 to 25. In this connection, in the sound signal playback machine of the first embodiment, the degree of LPF 71 to 75 is set at "4" (N2=4), and the degree of HPF 21 to 25 is set at "2" (N1=2).

The delay circuits 31 to 35 are provided as a phase matching means for matching a phase of the high frequency component extracted by HPF 21 to 25 with a phase of the low frequency component extracted by LPF 71 to 75. Delay time T1 (sec) of each delay circuit 31 to 35 is set at a value calculated by the equation of $$T1=(\phi 1-\phi 2+\pi\cdot n)/(2\pi\cdot Fc)$$

(n=. . . −2, −1, 0, 1, 2 . . . )

where φ1 (rad) is a phase angle at a cut-off frequency Fc (Hz) of HPF 21 to 25, and φ2 (rad) is a phase angle of LPF 71 to 75.

In this connection, in the sound signal playback machine of the first embodiment, the delay time of each delay circuit 31 to 35 is set at 5 msec (T1=5 msec).

The delay circuit 84 is provided as an auxiliary phase matching means for matching the phase of the low frequency component extracted by LPF 71 to 75 with the phase of the digitized sound signal in LFE channel in the case where sound signals $S_L$ to $S_C$ in the main channel and sound signal $S_{LFE}$ in LFE channel are correlated with each other. Delay time T2 (sec) of this delay circuit 84 is set at a value calculated by the equation of $$T2=(\phi 1+\pi\cdot n)/(2\pi\cdot Fc)$$

(n=. . . −2, −1, 0, 1, 2 . . . )

where φ1 (rad) is a phase angle at a cut-off frequency Fc (Hz) of the HPF 21 to 25.

The phase inversion circuit 82 is controlled so that a phase of a signal outputted from the signal adder 81 can be inverted when a phase difference between the signal outputted from the signal adder 81 and the signal outputted from the delay circuit 84 is π (rad) (180°). That is, when n in the equation to calculate delay time T1 is represented by n=. . . 3, −1, 1, 3 . . . , the phase inversion circuit 82 conducts a phase inversion motion. When n in the equation to calculate delay time T1 is represented by n=. . . −4, 2, 0, 2, 4 . . . , the phase inversion circuit 82 does not conduct a phase inversion motion. In this connection, the value of n is determined by HPF and LPF to be used. Therefore, when n=. . . −4, −2, 0, 2, 4 . . . , the phase inversion circuit 82 may not be provided.

Figure 3:
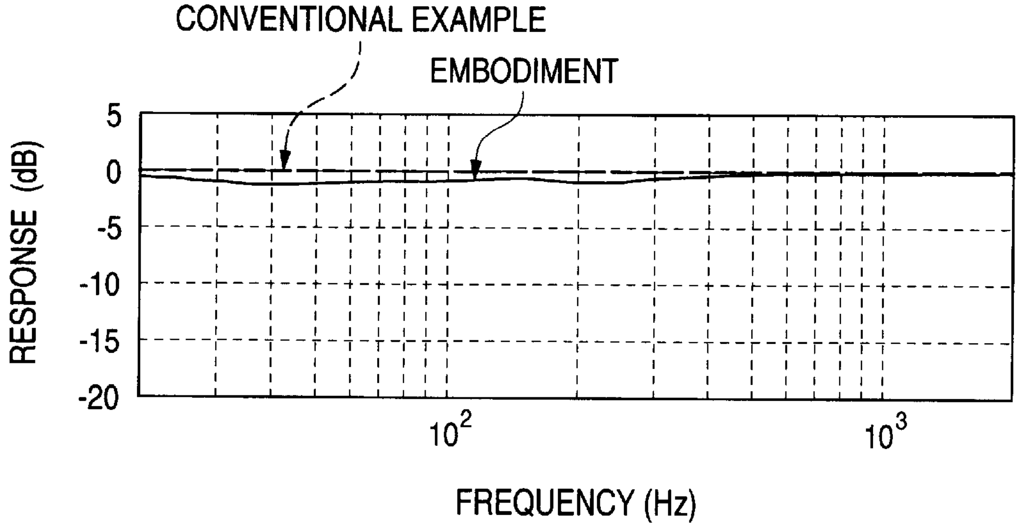
FIG. 3 is a characteristic diagram showing a frequency response of a sound signal playback machine of the first embodiment of the present invention.
Figure 4:
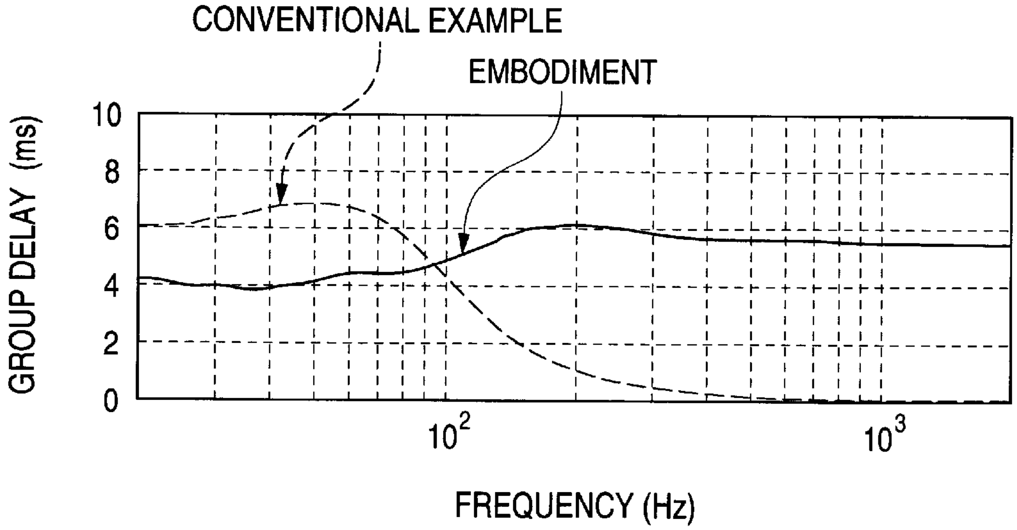
FIG. 4 is a characteristic diagram showing a group delay characteristic of a sound signal playback machine of the first embodiment of the present invention.

As described above, in the sound signal playback machine of the first embodiment, the degree of LPF 71 to 75 is set higher than the degree of HPF 21 to 25, and the delay circuits 31 to 35 are provided as a phase matching means. Therefore, the phase characteristic of a signal, which is obtained when the signal on the low frequency side and the signal on the high frequency side are electrically synthesized with each other, becomes substantially flat as shown in FIG. 3 although it is a little inferior to that of the prior art, and as shown in FIG. 4, the group delay characteristic becomes flat compared with that of the prior art in which the group delay is great in the low frequency band. Accordingly, sounds of low frequency can be faithfully played back, and a nuance of sounds of a musical instrument of low frequency can be improved. Therefore, multichannel sound playback can be excellently conducted. Since the delay circuit 84 is provided as an auxiliary phase matching means, even when sound signal $S_{LFE}$ of LFE channel and sound signals $S_L$ to $S_C$ in the main channel are correlated with each other, there is no possibility that the group delay is increased in the low frequency band.

Second Embodiment

Figure 5:
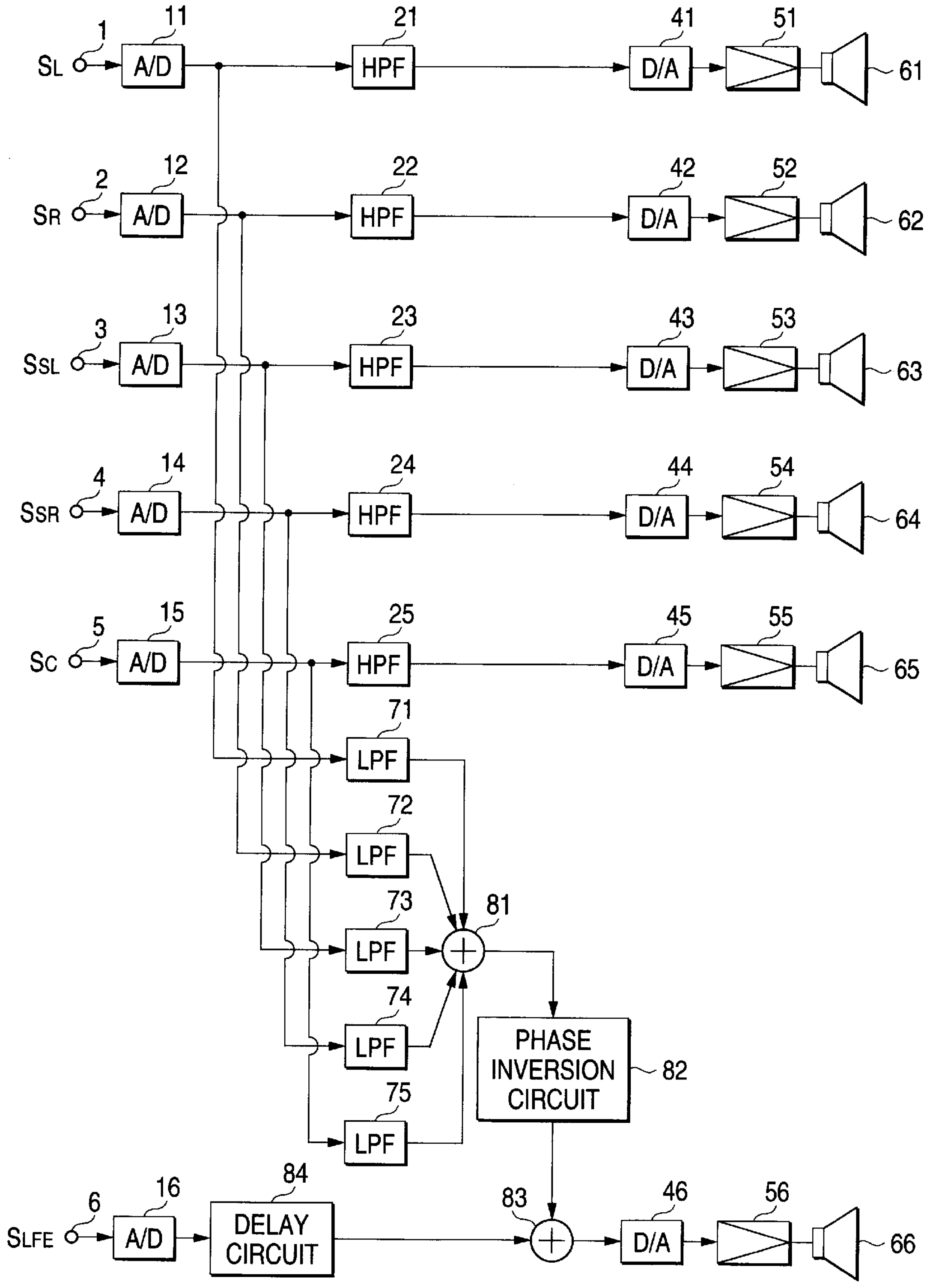
FIG. 5 is a block diagram showing a sound signal playback machine of the second embodiment of the present invention.
Figure 6:
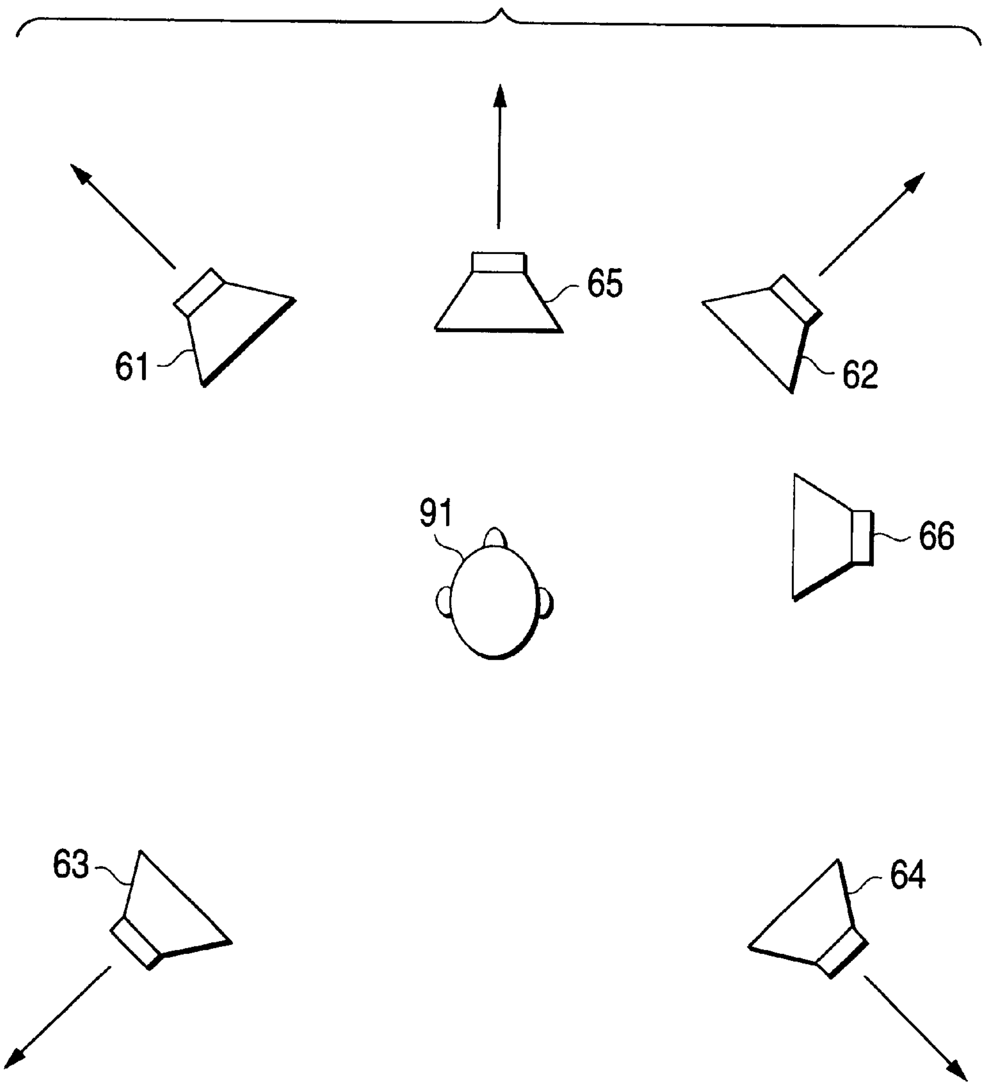
FIG. 6 is a view showing a position at which a speaker is arranged with respect to a listener in a sound signal playback machine of the second embodiment of the present invention.

FIG. 5 is a block diagram showing a sound signal playback machine of the second embodiment of the present invention. In this sound signal playback machine of the second embodiment, the delay circuits 31 to 35, which are arranged at the rear stage of HPF 21 to 25, are deleted from the sound signal playback machine (shown in FIG. 1) of the first embodiment described before, and the speakers 61 to 65 for the main channel are arranged being moved in a direction (direction shown by an arrow in the drawing) so that they can be separated from the listener 91 as shown in FIG. 6. In this case, a distance by which the speakers 61 to 65 are respectively moved is set at a value corresponding to delay time T1 of the deleted delay circuits 31 to 35. As a phase matching means, when the speakers 61 to 65 are respectively arranged being moved in a direction so that they can be separated from the listener 91, it is possible to provide the same effect as that of a case in which the signal on the high frequency band side is delayed. In this case, the speaker 66 used for LFE channel is arranged at the same position. In this connection, in FIG. 5, like reference characters are used to indicate like parts in the sound signal playback machine of the first embodiment described before and the sound signal playback machine of this second embodiment.

As described above, in the sound signal playback machine of the second embodiment, the degree of LPF 71 to 75 is set higher than the degree of HPF 21 to 25, and the speakers 61 to 65 used for the main channel are provided as a phase matching means being respectively moved in a direction so that they can be separate from the listener 91. Therefore, the sound signal playback machine of the second embodiment can provide the same effect as that of the sound signal playback machine of the first embodiment described before.

Third Embodiment

Figure 7:
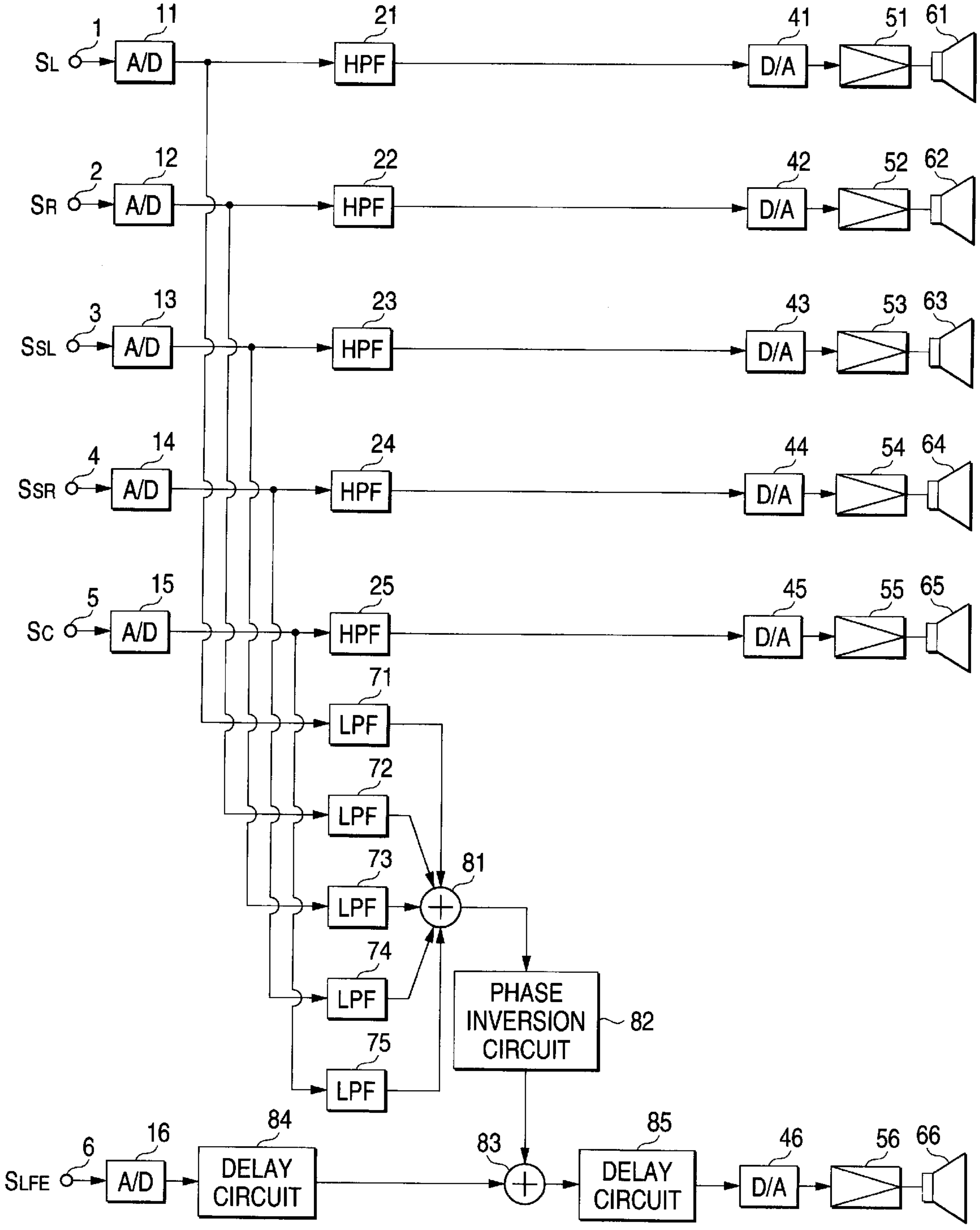
FIG. 7 is a block diagram showing a sound signal playback machine of the third embodiment of the present invention.
Figure 8:
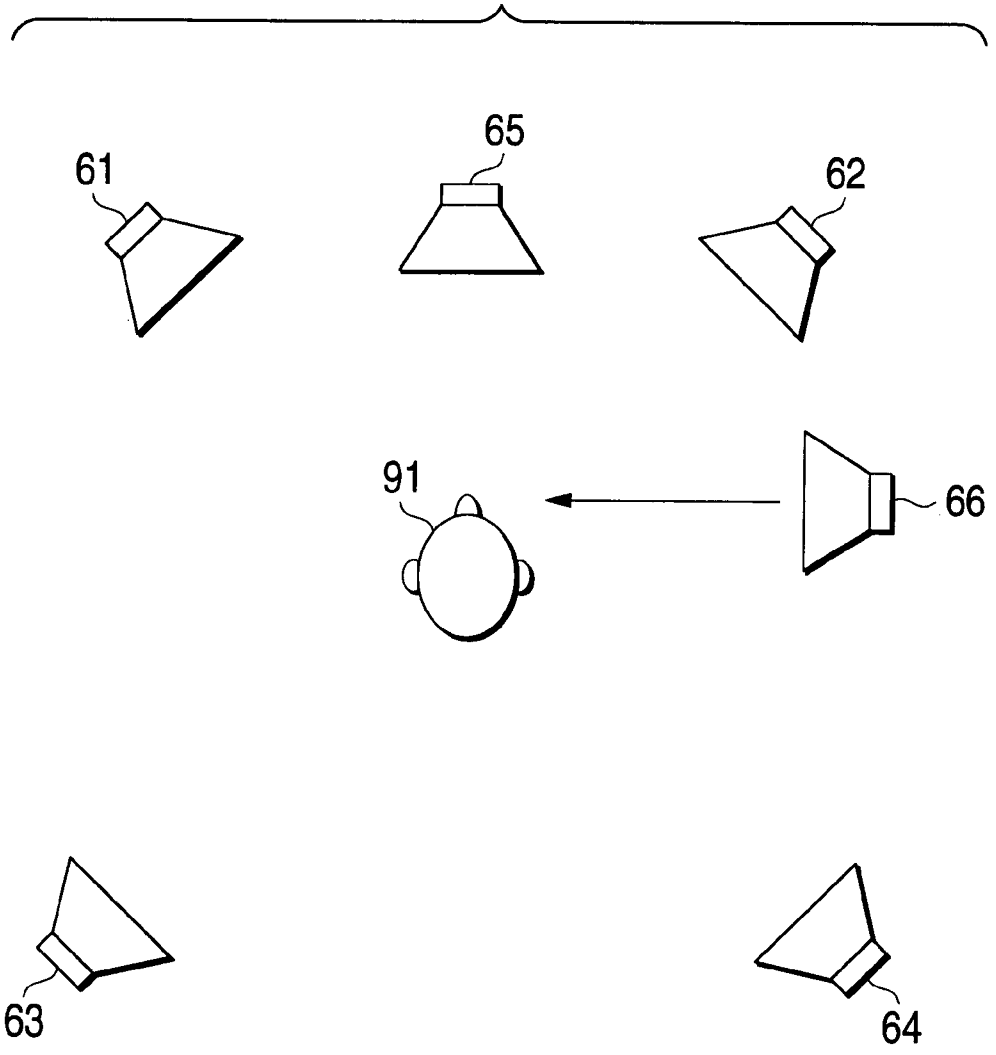
FIG. 8 is a view showing a position at which a speaker is arranged with respect to a listener in a sound signal playback machine of the third embodiment of the present invention.

FIG. 7 is a block diagram showing a sound signal playback machine of the third embodiment of the present invention. In this sound signal playback machine of the third embodiment, the delay circuits 31 to 35, which are arranged at the rear stage of HPF 21 to 25, are deleted from the sound signal playback machine (shown in FIG. 1) of the first embodiment described before, and the speaker 66 for the LFE channel is arranged being moved in a direction (direction shown by an arrow in the drawing) so that they can be approached to the listener 91 as shown in FIG. 8, and the delay circuit 85 to delay a signal is arranged at the rear stage of the signal adder 83. In this case, the distance by which the speaker 66 is moved and the delay time of the delay circuit 85 are set so that the time, which is obtained when the delay time of the delay circuit 85 is subtracted from the time corresponding to the distance by which the speaker 66 is moved, can coincide with delay time T1 of the deleted delay circuits 31 to 35. As a phase matching means, the speaker 66 is arranged being moved to a direction so that it can be approached to the listener 91, and the delay circuit 85 is arranged at the rear of the signal adder 83. Due to the foregoing, it is possible to provide the same effect as that of a case in which the signal on the high frequency band side is delayed. In this case, the speakers 61 to 65 used for the main channel are arranged at the same positions. In this connection, in FIG. 7, like reference characters are used to indicate like parts in the sound signal playback machine of the first embodiment described before and the sound signal playback machine of this third embodiment.

As described above, in the sound signal playback machine of the third embodiment, the degree of LPF 71 to 75 is set higher than the degree of HPF 21 to 25, and the speaker 66 used for the main channel is provided as a phase matching means being respectively moved in a direction so that it can be approached to the listener 91, and the delay circuit 85 is arranged at the rear of the signal adder 83. Therefore, the sound signal playback machine of the third embodiment can provide the same effect as that of the sound signal playback machine of the first embodiment.

Fourth Embodiment

Figure 9:
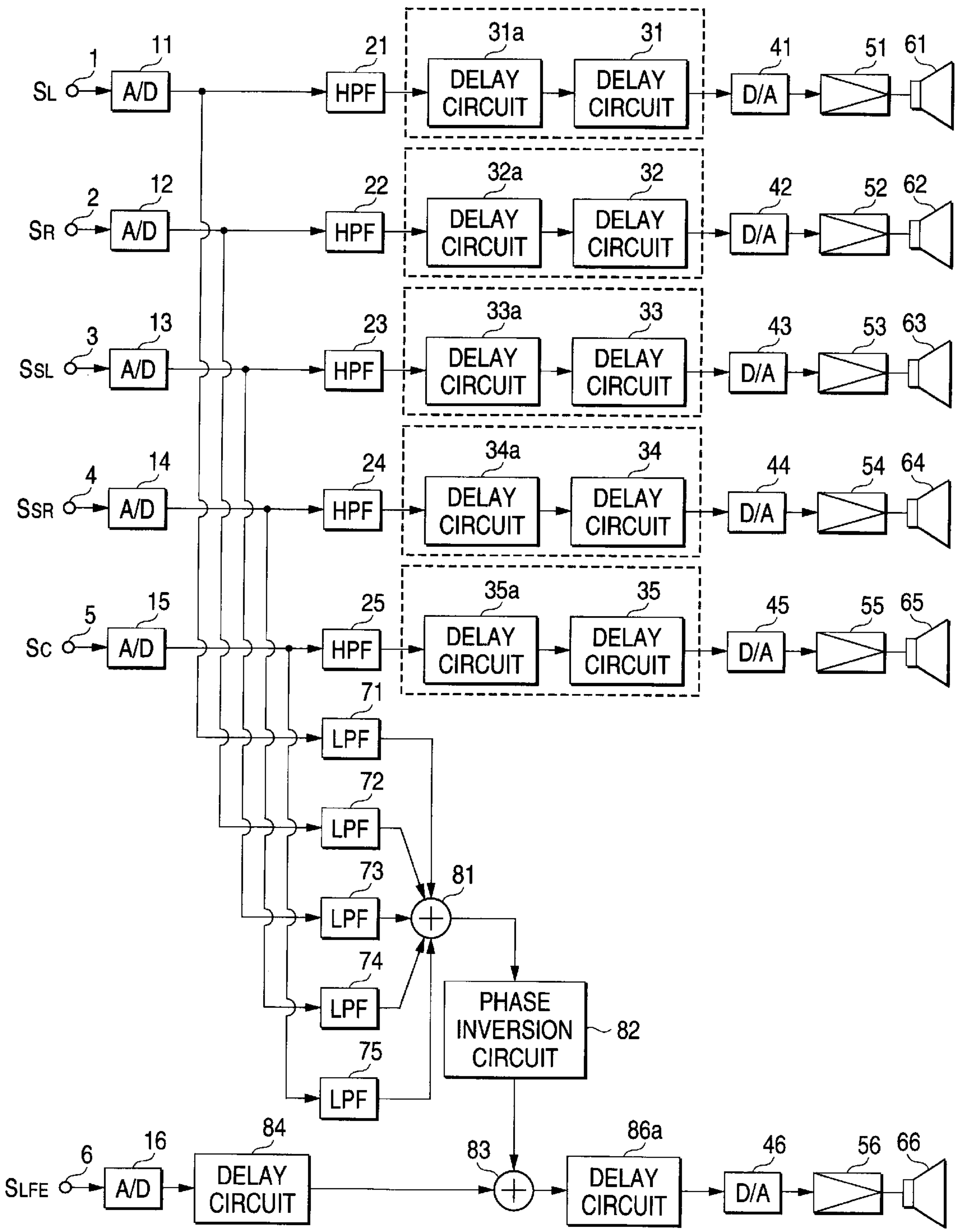
FIG. 9 is a block diagram showing a sound signal playback machine of the fourth embodiment of the present invention.
Figure 10:
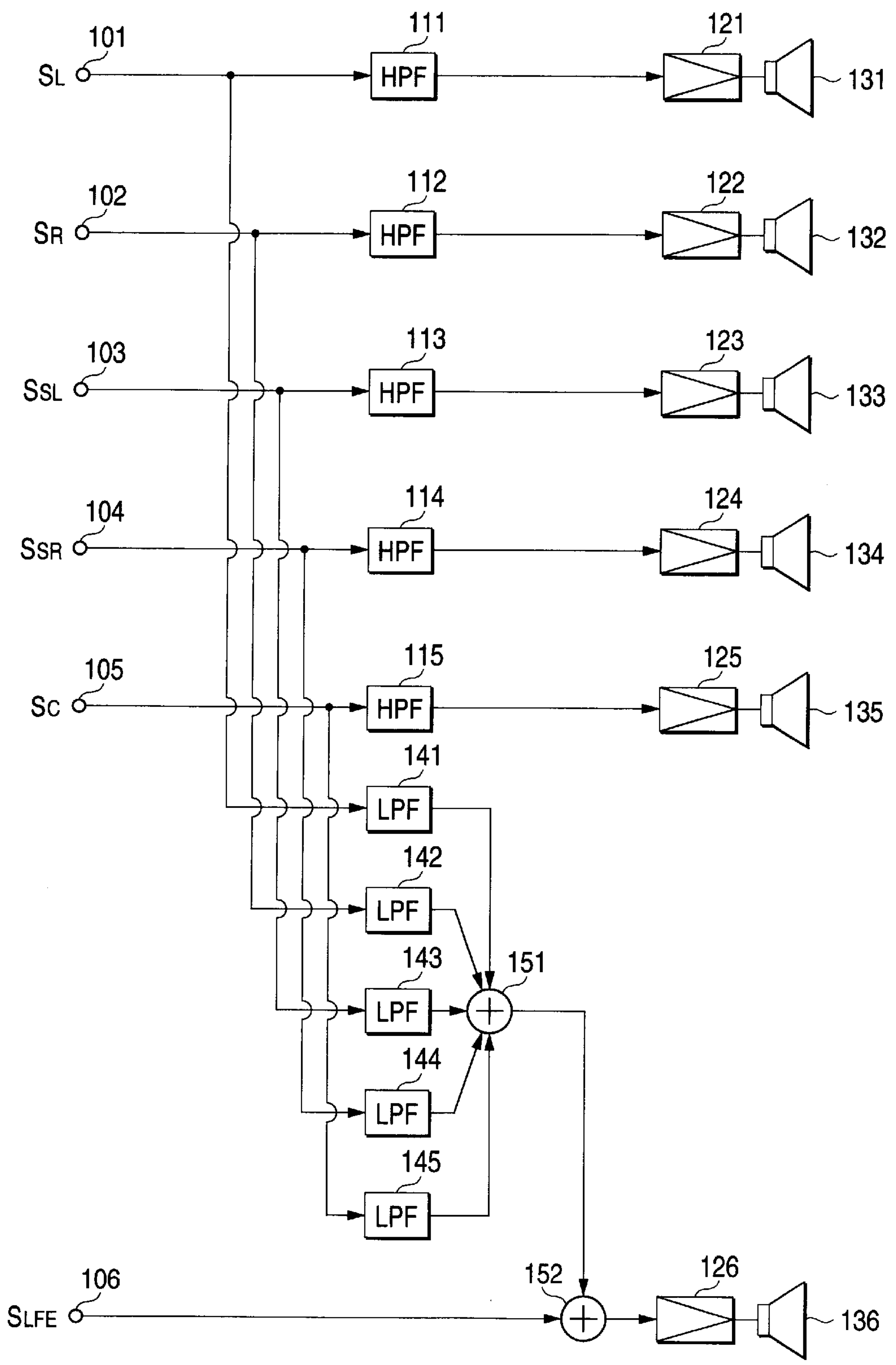
FIG. 10 is a block diagram showing a conventional sound signal playback machine.
Figure 11:
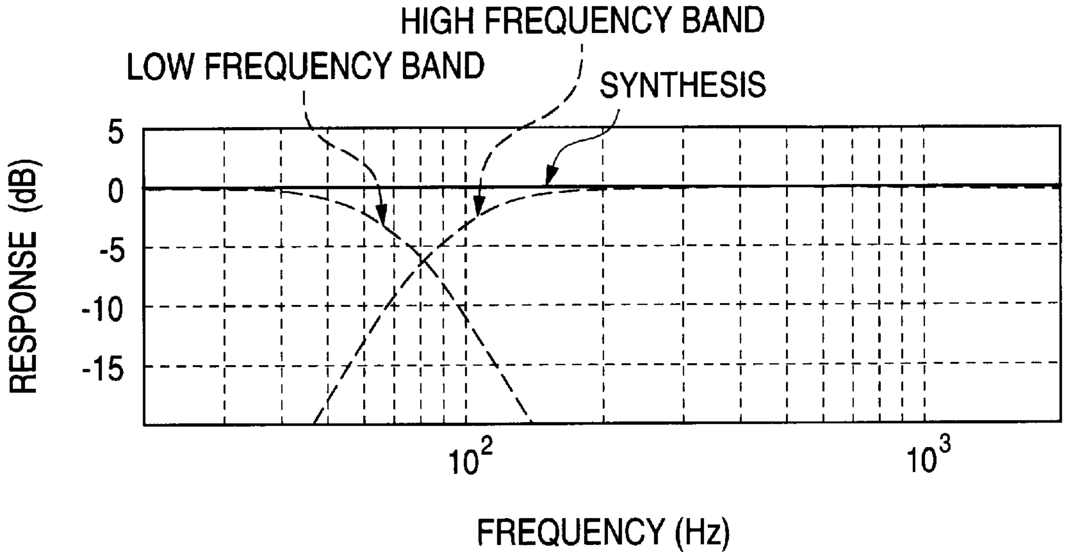
FIG. 11 is a characteristic diagram showing a frequency response of a conventional sound signal playback machine.
Figure 12:
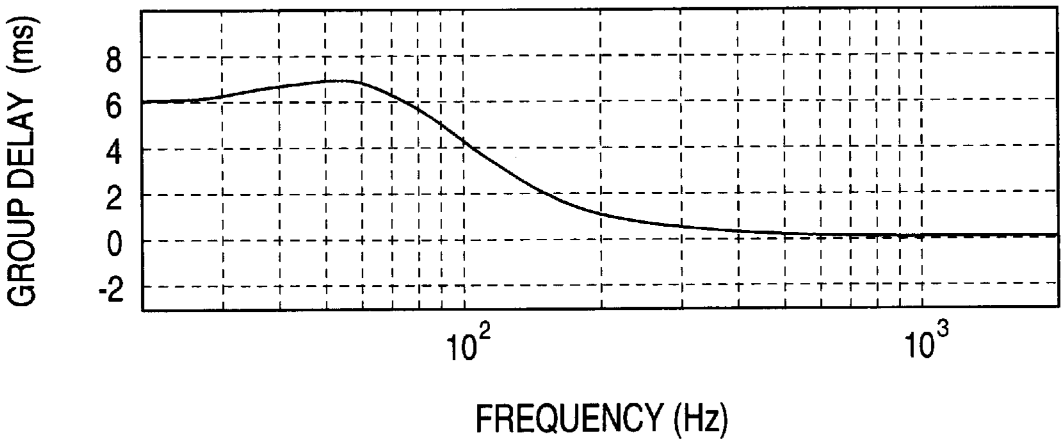
FIG. 12 is a characteristic diagram showing a group delay characteristic of a conventional sound signal playback machine.

FIG. 9 is a block diagram showing a sound signal playback machine of the fourth embodiment of the present invention. In the fourth embodiment, the present invention is applied to a sound signal playback machine which is housed in a so-called AV amplifier and provided with a speaker distance adjusting function. In FIG. 9, the signal input terminal 1, to which sound signal $S_L$ of channel L is supplied, is connected to the speaker 61 via the A/D converter 11 for converting analog/digital, HPF 21, delay circuits 31*a*, 31 for delaying a signal, D/A converter 41 for converting digital/analog and amplifier 51. Further, the signal input terminal 1 is connected to the signal adder 81 for adding a signal via the A/D converter 11 and LPF 71. The signal input terminal 2, to which sound signal $S_R$ of channel R is supplied, is connected to the speaker 62 via the A/D converter 12, HPF 22, delay circuits 32*a*, 32, D/A converter 42 and amplifier 52. Further, the signal input terminal 2 is connected to the signal adder 81 via the A/D converter 12 and LPF 72. Further, the signal input terminal 3, to which sound signal $S_{SL}$ of channel SL is supplied, is connected to the speaker 63 via the A/D converter 13, HPF 23, delay circuit 33*a*, 33, D/A converter 43 and amplifier 53. Furthermore, the signal input terminal 3 is connected to the signal adder 81 for adding a signal via the A/D converter 13 and LPF 73. Further, the signal input terminal 4, to which sound signal $S_{SR}$ of channel SR is supplied, is connected to the speaker 64 via the A/D converter 14, HPF 24, delay circuits 34*a*, 34, D/A converter 44 and amplifier 54. Further, the signal input terminal 4 is connected to the signal adder 81 for adding a signal via the A/D converter 14 and LPF 74. The signal input terminal 5, to which sound signal $S_C$ of channel C is supplied, is connected to the speaker 65 via the A/D converter 15, HPF 25, delay circuits 35*a*, 35, D/A converter 45 and amplifier 55. Further, the signal input terminal 5 is connected to the signal adder 81 for adding a signal via the A/D converter 15 and LPF 75. This signal adder 81 is connected to the signal adder 83 via the phase inversion circuit 82 for inverting a phase of a signal in the same manner as that of the first embodiment described before. On the other hand, the signal input terminal 6, to which sound signal $S_{LFE}$ of channel LFE is supplied, is connected to the signal adder 83 via A/D converter 16 and the delay circuit 84 for delaying a signal. This signal adder 83 is connected to the speaker 66 via the delay circuit 86*a* for delaying a signal, D/A converter 46 and the amplifier 56.

In this case, the speakers 61 to 66, HPF 21 to 25, LPF 71 to 75, delay circuits 31 to 35, phase inversion circuit 82 and delay circuit 84 are the same as those of the first embodiment described before. Therefore, the explanations are omitted here.

Each delay circuit 31*a* to 35*a* fulfills a function of adjusting a speaker distance. In order to adjust a distance from the listener 91 to each speaker 61 to 65 used for the main channel shown in FIG. 2, the delay circuit 31*a* to 35*a* respectively delays a component of the high frequency band extracted by HPF 21 to 25. The delay time of the delay circuit 31*a* to 35*a* is set at a value calculated from the distance to be adjusted and the sound velocity. Actually, as shown by broken lines in FIG. 9, the delay circuit 31*a* for adjusting the speaker distance and the delay circuit 31 for matching the phase may be arranged being integrated with each other, and the delay time in this case may be obtained by adding the delay time in the delay circuit 31*a* to the delay time in the delay circuit 31. Concerning the delay circuits 32*a* to 35*a* for adjusting the speaker distance and the delay circuits 32 to 35 for matching the phase, the delay time can be obtained in the same manner. In this connection, the delay circuit 86*a* fulfills a function of adjusting the speaker distance. The delay circuit 86*a* delays a signal sent from the signal adder 83 so as to adjust a distance from the listener 91 to the speaker 66 used for the LFE channel.

As described above, in the sound signal playback machine of the fourth embodiment, the degree of LPF 71 to 75 is set higher than the degree of HPF 21 to 25, and the delay circuits 31 to 35 are provided as a phase matching means. Therefore, the same effect as that of the sound signal playback machine of the first embodiment can be provided.

In the first to the fourth embodiment, a phase converting circuit for conducting fine adjustment on the group delay may be arranged at the front stage of each of A/D converters 11 to 15. Signal processing may be conducted not by digital processing but by analogue processing.

As can be seen from the above explanations, according to the present invention, the degree of the low frequency pass filter is set higher than the degree of the high-frequency-pass-filter, and the phase of the high frequency component extracted by the high frequency pass filter and the phase of the low frequency component extracted by the low frequency pass filter are matched to each other. Therefore, the group delay characteristic of the signal, which is obtained when the signal on the low frequency band side and the signal on the high frequency band side are electrically synthesized with each other, becomes substantially flat. Accordingly, sounds of low frequency can be faithfully played back and a nuance of sounds of a musical instrument of low frequency can be improved. Therefore, sounds can be excellently played back by means of multichannel playback.

What is claimed is:

1. A sound signal playback machine comprising:

a high frequency pass filter for extracting a predetermined high frequency component from a sound signal in a main channel;

a first speaker for playing back the high frequency component extracted by the high frequency pass filter;

a low frequency pass filter for extracting a predetermined low frequency component from the sound signal in the main channel;

a signal adder for outputting an addition signal in which the low frequency component extracted by the low frequency pass filter is added to a sound signal in a channel exclusively used for a low frequency band; and a second speaker for playing back the addition signal outputted from the signal adder, wherein the degree of the low frequency pass filter is set higher than that of the high frequency pass filter, and wherein the sound signal playback machine further comprising a phase matching unit for matching the phase of the high frequency component extracted by the high frequency pass filter with the phase of the low frequency component extracted by the low frequency pass filter.

2. The sound signal playback machine according to claim 1, wherein the phase matching unit is a delay circuit for delaying the high frequency component extracted by the high frequency pass filter.

3. The sound signal playback machine according to claim 2, wherein delay time T1 (sec) of the delay circuit is set at a value calculated by the equation of $$T1=(\phi 1-\phi 2+\pi\cdot n)/(2\pi\cdot Fc)$$

(n=. . . −2, −1, 0, 1, 2 . . . )

where $\phi 1$ (rad) is a phase angle at a cut-off frequency Fc (Hz) of the high frequency pass filter, and $\phi 2$ (rad) is a phase angle of the low frequency pass filter.

4. The sound signal playback machine according to claim 1, wherein the phase matching unit is to set the first speaker by moving it in a direction so that the first speaker can be separated from a listener.

5. The sound signal playback machine according to claim 1, wherein the phase matching unit is to set the second speaker by moving it in a direction so that the second speaker can be approached to a listener, and the phase matching means is also a delay circuit for delaying the addition signal outputted from the signal adder.

6. The sound signal playback machine according to claim 1, further comprising an auxiliary phase matching unit adapted to match the phase of the low frequency component extracted by the low frequency pass filter with the phase of the sound signal in the channel exclusively used for the low frequency band.

7. The sound signal playback machine according to claim 6, wherein the auxiliary phase matching unit is a delay circuit for delaying the sound signal in the channel exclusively used for the low frequency band.

8. The sound signal playback machine according to claim 7, wherein delay time T2 (sec) of the delay circuit is set at a value calculated by the equation of $$T2=(\phi 1+\pi\cdot n)/(2\pi\cdot Fc)$$

(n=. . . −2, −1, 0, 1, 2 . . . )

where $\phi 1$ (rad) is a phase angle at a cut-off frequency Fc (Hz) of the high frequency pass filter.

9. The sound signal playback machine according to claim 1, further comprising a phase inversion circuit for inverting a phase of the low frequency component extracted by the low frequency pass filter when a difference between the phase of the low frequency component extracted by the low frequency pass filter and the phase of the sound signal in the channel exclusively used for the low frequency is $\pi$ (rad).

10. A sound signal playback method comprising the steps of:

extracting a predetermined high frequency component from a sound signal in a main channel by a high frequency pass filter;

playing back the high frequency component, which has been extracted by the high frequency pass filter, by a first speaker;

extracting a predetermined low frequency component from the sound signal in the main channel by a low frequency pass filter;

adding the low frequency component extracted by the low frequency pass filter to a sound signal in the channel exclusively used for the low frequency by a signal adder and outputting an addition signal; and playing back the addition signal, which has been outputted from the signal adder, by a second speaker, wherein the degree of the low frequency pass filter is set higher than that of the high frequency pass filter, and wherein the phase of the high frequency component extracted by the high frequency pass filter and the phase of the low frequency component extracted by the low frequency pass filter are matched with each other.

11. The sound signal playback method according to claim 10, wherein the phase of the high frequency component extracted by the high frequency pass filter and the phase of the low frequency component extracted by the low frequency pass filter are matched with each other when the high frequency component extracted by high frequency pass filter is delayed by the delay circuit.

12. The sound signal playback method according to claim 11, wherein delay time T1 (sec) of the delay circuit is set at a value calculated by the equation of $$T1=(\phi 1-\phi 2+\pi\cdot n)/(2\pi\cdot Fc)$$

(n=. . . −2, −1, 0, 1, 2 . . . )

where $\phi 1$ (rad) is a phase angle at a cut-off frequency Fc (Hz) of the high frequency pass filter, and $\phi 2$ (rad) is a phase angle of the low frequency pass filter.

13. The sound signal playback method according to claim 10, wherein the phase of the high frequency component extracted by the high frequency pass filter and the phase of the low frequency component extracted by the low frequency pass filter are matched with each other when the first speaker is arranged by moving so that it can be separated from a listener.

14. The sound signal playback method according to claim 10, wherein the phase of the high frequency component extracted by the high frequency pass filter and the phase of the low frequency component extracted by the low frequency pass filter are matched with each other when the second speaker is arranged by moving so that it can be separated from a listener and the addition signal outputted from the signal adder is delayed by the delay circuit.

15. The sound signal playback method according to claim 10, wherein the phase of the low frequency component extracted by the low frequency pass filter and the phase of the sound signal in the channel exclusively used for the low frequency band are matched with each other.

16. The sound signal playback method according to claim 15, wherein the phase of the low frequency component extracted by the low frequency pass filter and the phase of the sound signal in the channel exclusively used for the low frequency band are matched with each other by delaying the sound signal in the channel exclusively used for the low frequency band by the delay circuit.

17. The sound signal playback method according to claim 16, wherein delay time T2 (sec) of the delay circuit is set at a value calculated by the equation of $$T2=(\phi1+\pi\cdot n)/(2\pi\cdot Fc)$$

(n=. . . −2, −1, 0, 1, 2 . . . )

where $\phi1$ (rad) is a phase angle at a cut-off frequency Fc (Hz) of the high frequency pass filter.

18. The sound signal playback method according to claim 10, wherein the phase of the low frequency component extracted by the low frequency pass filter is inverted by the phase inversion circuit when a difference between the phase of the low frequency component extracted by the low frequency pass filter and the phase of the sound signal in the channel exclusively used for the low frequency is $\pi$ (rad).

* * * * *